United States Patent [19]

Ali

[11] Patent Number: 5,534,633

[45] Date of Patent: Jul. 9, 1996

[54] AMINOKETONE SENSITIZERS FOR PHOTOPOLYMER COMPOSITIONS

[75] Inventor: M. Zaki Ali, Woodbury, Minn.

[73] Assignee: Minnesota Mining and Manufacturing Company, St. Paul, Minn.

[21] Appl. No.: 383,363

[22] Filed: Feb. 3, 1995

Related U.S. Application Data

[60] Division of Ser. No. 234,760, Apr. 28, 1994, Pat. No. 5,415,976, which is a continuation-in-part of Ser. No. 199,542, Feb. 18, 1994, abandoned, which is a continuation of Ser. No. 784,468, Oct. 25, 1991, abandoned.

[51] Int. Cl.$^6$ .................. C07D 311/16; C07D 405/10
[52] U.S. Cl. ............... 546/196; 540/567; 540/581; 540/553; 544/361; 546/66; 546/198; 549/287
[58] Field of Search .............. 546/196, 66; 544/361; 549/287

[56] References Cited

U.S. PATENT DOCUMENTS

| | | | |
|---|---|---|---|
| 4,147,552 | 4/1979 | Specht et al. | 96/115 R |
| 4,278,751 | 7/1981 | Specht et al. | 430/281 |
| 4,289,844 | 9/1981 | Specht et al. | 430/281 |
| 4,366,228 | 12/1982 | Specht et al. | 430/281 |
| 4,369,310 | 1/1983 | Postle | 542/442 |
| 4,505,793 | 3/1985 | Tamoto et al. | 204/159 |
| 4,507,382 | 3/1985 | Rousseau et al. | 430/275 |
| 4,576,975 | 3/1986 | Reilly, Jr. | 522/13 |
| 4,713,312 | 12/1987 | Adair et al. | 438/130 |
| 4,755,450 | 7/1988 | Sanders et al. | 430/285 |
| 4,921,827 | 5/1990 | Ali et al. | 502/167 |
| 4,965,171 | 10/1990 | Kawabata et al. | 430/288 |
| 4,971,892 | 11/1990 | Ali et al. | 430/281 |
| 5,480,994 | 1/1996 | Ali | 546/196 |

FOREIGN PATENT DOCUMENTS

| | | | |
|---|---|---|---|
| 0279475 | 4/1986 | European Pat. Off. | C07C 97/10 |
| 0538997A1 | 4/1993 | European Pat. Off. | G03F 7/031 |
| 63-168403 | 7/1988 | Japan | C08F 2/50 |
| 63-309502 | 12/1988 | Japan | C08F 2/50 |

*Primary Examiner*—Mukund J. Shah
*Assistant Examiner*—King Lit Wong
*Attorney, Agent, or Firm*—Gary L. Griswold; Walter N. Kirn; Susan Moeller Zerull

[57] ABSTRACT

Aminoketone-substituted coumarin sensitizers having tethered tertiary amino groups are described which have extremely good photosensitivity. The sensitizers of the instant invention have the formula:

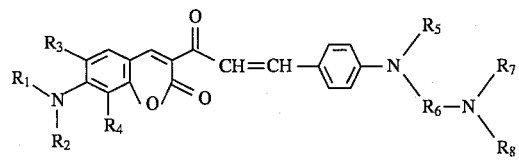

wherein $R_1$ and $R_2$ each represent an alkyl group having 1 to 6 carbon atoms, and $R_3$ and $R_4$ each represent hydrogen; or at least one of $R_1$ and $R_3$ or $R_2$ and $R_4$ together represent an alkylene group having 2 to 4 carbon atoms, $R_5$ represents an alkyl group having 1 to 6 carbon atoms or H, $R_6$ represents an alkylene group having 1 to 6 carbon atoms, and $R_7$ and $R_8$ each independently represent an alkyl group having 1 to 6 carbon atoms, both of $R_7$ and $R_8$ taken together represent an alkylene group having 4 to 6 carbon atoms, or $R_5$ or $R_6$ taken together with $R_7$ or $R_8$ represent a five, six, or seven membered heterocyclic ring group. Photopolymer compositions comprising a free-radically polymerizable material, a photoinitiator, and an aminoketone-substituted coumarin sensitizer, are also disclosed.

11 Claims, No Drawings

AMINOKETONE SENSITIZERS FOR PHOTOPOLYMER COMPOSITIONS

This is a divisional of prior application Ser. No. 08/234,760 filed Apr. 28, 1994 now U.S. Pat. No. 5,415,976, which was a continuation-in-part of application Ser. No. 8/199,542 filed Feb. 18, 1994, abandoned which was a continuation of application Ser. No. 07/784,468 filed Oct. 25, 1991, abandoned.

BACKGROUND OF THE INVENTION

1. Field of the Invention

This invention relates to spectral sensitizers useful in photopolymer applications, for example printing plate and proofing applications. More particularly this invention relates to aminoketone-substituted coumarin sensitizers having tethered tertiary amino groups.

2. Background of the Art

Photoinitiators for polymerization reactions ordinarily have an inherent, but limited range of natural radiation sensitivity. Only when the photoinitiators are stimulated by these particular ranges or wavelengths of sensitivity do the photoinitiators display their desired functional ability. It is not feasible and/or economic to attempt to provide different photoinitiators for each different range of wavelengths to which one would desire a polymerizable system to be sensitive. It is therefore better to find ways of changing the wavelength range of sensitivity for a given photoinitiator. Changes in sensitivity can be made by structural alteration of the photoinitiator, but a more accepted and more easily performed method is spectral sensitization of the photoinitiator. This procedure is commonly practiced by finding dyes which absorb radiation in the desired range of wavelengths and which activate the photoinitiator after absorption of the radiation. For each photoinitiator system it is difficult to predict which specific dyes will be able to effectively act as efficient sensitizers. Even though some dyes may work with more than one photoinitiator (or other photosensitive systems such as silver halides, tetrahydracarbyl borates, etc.), there is seldom any certainty that a compound or class of compounds will work with a particular photoinitiator.

Since many spectral sensitizing dyes which absorb visible radiation to perform their function, they may be colored and add an undesirable color, tone, or hue to the polymerized material. It is often desirable to provide spectral sensitizing dyes which may be treated to lose their color after they have been used as spectral sensitizers. This can be accomplished in many ways such as thermal bleaching or photobleaching of the dyes.

Sensitizers may also be used which merely increase the speed (sensitivity) of the photoinitiators at those wavelengths to which they are naturally sensitive.

Japanese published applications 63-168403 (Fuji; publication date Jul. 12, 1988) and 63-309502 (Hitachi; publication date Jul. 12, 1988) generically disclose photopolymerizable compositions containing aminoketone and ketocoumarin sensitizing dyes. Neither application describes specific examples which are within the scope of, or demonstrate, the surprising increases in speed associated with the instant invention.

Published EPO application 290,133 (claiming priority to U.S. Ser. No. 034,065 filed Apr. 2, 1987 and assigned to Minnesota Mining and Manufacturing Company) describes aminostyryl dyes in combination with a sensitizer and an electron donor (which may be a tertiary amine). The published EPO application does not describe the advantages derived from linking the tertiary amine to the sensitizer. Compounds of the instant invention are shown in the examples to have higher sensitivity in photopolymer compositions than those of said published application.

Specht et al. (U.S. Pat. Nos. 4,147,552; 4,289,844; and 4,278,751; Jul. 14, 1981) disclose aminoketone-substituted coumarins having a variety of substituents including tertiary amino substituents. These patents do not teach the particular advantage of increased photosensitivity of the compounds of the present invention. The aminoketone-substituted coumarin sensitizers materials of Specht et al. do not fall within the formula of the instant invention.

Adair et al. (U.S. Pat. No. 4,713,312; Dec. 15, 1987) discloses the use of aminoketone-substituted coumarins as sensitizers for photosensitive microcapsules. Those material disclosed are essentially similar to those of U.S. Pat. No. 4,147,552.

U.S. Pat. No. 4,289,844 (Specht et al.)and U.S. Pat. No. 4,247,623 (Guild) disclose aminoketone-substituted coumarin sensitizers in combination with amine activators. Neither patent teaches the principal advantage (i.e., speed) which is achieved when a tertiary amine is covalently tethered to an aminoketone-substituted coumarin sensitizer, instead of being added as a secondary component.

SUMMARY OF THE INVENTION

The instant invention relates to very efficient spectral sensitizers for iodonium and triazine photoinitiators which are useful in photopolymer applications, wherein the spectral sensitizers have the formula:

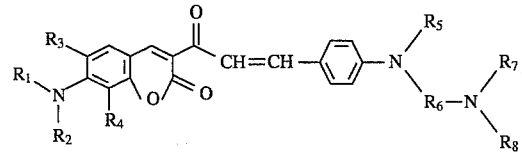

wherein $R_1$ and $R_2$ each represent an alkyl group having 1 to 6 carbon atoms, and $R_3$ and $R_4$ each represent hydrogen; or at least one of $R_1$ and $R_3$ or $R_2$ and $R_4$ together represent an alkylene group having 2 to 4 carbon atoms, $R_5$ represents an alkyl group having 1 to 6 carbon atoms or H, $R_6$ represents an alkylene group having 1 to 6 carbon atoms, and $R_7$ and $R_8$ each independently represent an alkyl group having 1 to 6 carbon atoms, both of $R_7$ and $R_8$ taken together represent an alkylene group having 4 to 6 carbon atoms, or $R_5$ or $R_6$ taken together with $R_7$ or $R_8$ represent a five, six, or seven membered heterocyclic ring group.

In another aspect this invention relates to imageable layers comprising a substrate coated thereon with a free-radically polymerizable compound, a photoinitiator, a spectral sensitizer as described,, and optionally a binder.

DETAILED DESCRIPTION OF THE INVENTION

The term "aminoketone" as used herein means a chemical substance having within its structural formula the substructure:

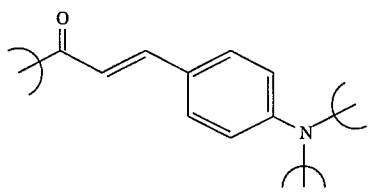

Aminoketone-substituted coumarin sensitizers with tethered tertiary amino groups according to the present invention have extremely good photosensitivity. Said sensitizers have the formula:

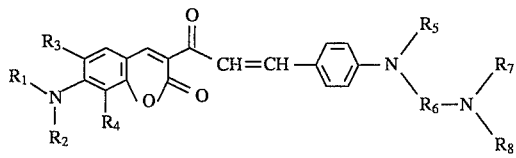

wherein $R_1$ and $R_2$ each represent an alkyl group having 1 to 6 carbon atoms, and $R_3$ and $R_4$ each represent hydrogen; or at least one of $R_1$ and $R_3$ or $R_2$ and $R_4$ together represent an alkylene group having 2 to 4 carbon atoms, $R_5$ represents an alkyl group having 1 to 6 carbon atoms or H, $R_6$ represents an alkylene group having 1 to 6 carbon atoms, $R_7$ and $R_8$ each independently represent an alkyl group having 1 to 6 carbon atoms, both of $R_7$ and $R_8$ taken together represent an alkylene group having 4 to 6 carbon atoms, or $R_5$ or $R_6$ taken together with $R_7$ or $R_8$ represent a five, six, or seven membered heterocyclic ring group. $R_7$ and $R_8$ preferably together represent an alkylene group of 4 to 6 carbon atoms forming a cyclic group with the N atom to which they are attached.

The sensitizers of the instant invention are particularly useful when employed in photosensitive compositions. Said photosensitive compositions comprise a solvent soluble free-radical polymerizable monomer or oligomer, a photoinitiator, and optionally a binder.

While not being bound by theory, it is believed to have been determined by the inventor in the discovery of this invention that the tethered tertiary amine functions in essentially the same manner as when a tertiary amine is added separately as an activator, yet provides for superior performance when tethered. It is believed that it may be important for the tertiary amine to be electronically isolated from the π-electron system of the sensitizer. This is accomplished in the instant invention by tethering the tertiary amine to the sensitizer by means of an alkylene group. As shown in the examples below, a synergistic increase in speed results from tethering a tertiary amine to an aminoketone-substituted coumarin sensitizer.

Monomers useful in the instant invention may be mono-, di-, or poly-functional. Examples of suitable monomers useful in this invention are well known and listed in many patents, e.g., U.S. Pat. Nos. 3,895,949 and 4,037,021 and include, but are not limited to, acrylate, methacrylate, and acrylamide moiety containing monomers (e.g., ethyl methacrylate, pentaerythritol triacrylate, pentaerythritol tetraacrylate, N-ethylacrylamide, tris(2-acryloxyethyl)isocyanurate, tris(2-methylacryloxyethyl)isocyanurate, 2-acetoxyethyl methacrylate, tetrahydrofurfuryl methacrylate, bis[4-(2-acryloxyethyl)phenyl]dimethyl methane, diacetone acrylamide, and acrylamidoethyl methacrylate, etc.) Suitable oligomers include, but are not limited to, acrylate end-capped urethane, acrylate, and polyether oligomers, and carboxyl substituted urethane oligomers such as P-11 (described in U.S. Pat. No. 4,228,232). Suitable reactive polymers are described in U.S. Ser. No. 07/658,983. Preferred monomers are acrylate and methacrylate containing monomers oligomers. Carboxyl substituted urethane oligomers are highly preferred.

The aminoketone-substituted coumarin sensitizers of the instant invention may generally be used in combination with a photoinitiator. The photoinitiator may be either a single compound which generates radicals on exposure to radiation or a combination of two or more components. Initiation may be direct or sensitized. Preferred photoinitiators are sensitized or unsensitized halomethyltriazines (described in U.S. Pat. No. 3,775,113) and sensitized diaryliodonium salts (described in U.S. Pat. Nos. 3,729,313, 4,058,400, 4,058,401, and 4,921,827), incorporated herein by reference. Suitable sensitizers for the preferred photoinitiators for use in addition to the sensitizers for the present invention are described in the foregoing references.

The preferred diaryliodonium salts useful in practice of the instant invention may be generally described by the formulae given in U.S. Pat. No. 4,460,154, that is

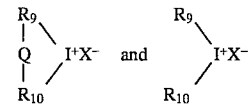

wherein $R_9$ and $R_{10}$ are individually selected from aromatic groups. Such aromatic groups may have from 4 to 20 carbon atoms (e.g., substituted or unsubstituted phenyl, naphthyl, thienyl, and furanyl) with substantially any substitution.

Q is selected from a carbon-carbon bond, oxygen, sulfur,

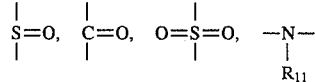

wherein $R_{11}$ is aryl (e.g., 6 to 20 carbon atoms) or acyl (e.g., 2 to 20 carbon atoms), or $R_{12}$—C—$R_{13}$ wherein $R_{12}$ and $R_{13}$ are selected from hydrogen, alkyl groups of 1 to 4 carbon atoms, and alkenyl groups of 2 to 4 carbon atoms; and X⁻ is any anion, preferably an anion that does not react with essential components or interfere with the function of other components in the system. Examples of particularly useful anions are well known in the imaging art and include, but are not limited to anions with a unitary negative charge such as chloride, bromide, iodide, alkyl and aryl carboxylates, alkyl and aryl sulfonates (e.g. para-toluene sulfonate), bicarbonate, hexafluorophosphate, etc., and anions with a negative charge greater than 1 such as sulfate, phosphate, and the like. Preferably X⁻ represents iodide, chloride, bromide, tetrafluoroborate, hexafluoroantimonate, or hexafluorophosphate.

Examples of diaryliodonium cations useful in the practice of the instant invention are diphenyliodonium, di(4-chlorophenyl)iodonium, 4-trifluoromethylphenylphenyliodonium, 4-ethylphenylphenyliodonium, di(4-acetylphenyl)iodonium, tolylphenyliodonium, anisylphenyliodonium, 4-butoxyphenylphenyliodonium, di(4-phenylphenyl)iodonium, di(carbomethoxyphenyl)iodonium, etc. Examples of these iodonium cations are disclosed in U.S. Pat. Nos. 3,729,3 13, 4,076,705, and 4,386,154.

Examples of substituted halomethyltriazines useful in the practice of the instant invention are 2,4-bis(trichloromethyl)-6-methyl-s-triazine, 2,4,6-tris(trichloromethyl)-s-triazine, and styryl substituted triazines such as 2,4-bis(trichloromethyl)-6-(4'-methoxystyryl)-s-triazine, 2,4-bis(trichloromethyl)-6-(p-dimethylaminostyryl)-s-triazine, 2,4-bis(trichloromethyl)-6-(2', 4'-diethoxystyryl)-s-triazine, etc. These compounds are described, for example, in U.S. Pat. Nos. 3,515,552, 3,536,489, 3,617,288, 3,640,718, 3,779,778, 4,386,154, 3,954,475, and 3,987,037.

Photopolymerization of the photosensitive compositions of the instant invention occurs on exposure of the compositions to any source of radiation emitting actinic radiation at a wavelength within the ultraviolet and visible spectral regions. Suitable sources of radiation include, but are not limited to mercury, xenon, carbon arc and tungsten filament lamps, lasers, sunlight, etc. Exposures may be from less than about 1 microsecond to 10 minutes or more depending upon the amounts of particular polymerizable materials, the photoinitiator being utilized and depending upon the radiation source and distance from the source and thickness of the coating to be cured. The photoinitiator is used at a concentration of about 0.01 to 10 percent by weight of the solids content of the coated and dried photosensitive composition.

The photosensitive compositions of the instant invention are normally coated onto a substrate for use in various imaging applications. Substrates may be transparent or opaque. Suitable substrates on which the compositions of the instant invention may be supported include, but are not limited to, metals (for example, steel and aluminum plates including aluminum treated with hydrophilizing agents such as silicates or polyacrylic acid and its derivatives, sheets, and foils); films or plates composed of various film-forming synthetic or high polymers including addition polymers (e.g., poly(vinylidene chloride), poly(vinyl chloride), poly(vinyl acetate), polystyrene, polyisobutylene polymers and copolymers), and linear condensation polymers (e.g., poly(ethylene terephthalate), poly(hexamethylene adipate), poly(hexamethylene adipamide/adipate)). Aluminum is a preferred substrate. Silicated and/or anodized aluminum is particularly preferred.

A binder may optionally be present in photosensitive compositions of the instant invention. Any natural or synthetic aqueous solvent-soluble (or even nonaqueous solvent-soluble in amounts up to about 15 percent by weight) polymeric binder may be used in the practice of this invention. Organic polymeric resins may be used. Thermoplastic resins are generally preferred. Examples of suitable binders are sulfonated polystyrene, polyvinyl alcohol, starch, polymethyl methacrylate, polyvinyl acetate, and the like. Beyond these minimal requirements, there is no criticality in the selection of a binder. In fact, even transparency or translucency are not required although they are desirable.

The imageable layers of the instant invention may contain various materials in combination with the essential ingredients of the instant invention. For example, plasticizers, coating aids, antioxidants in amounts sufficient to prevent premature cross-linking insufficient to prevent crosslinking of the energy sensitive polymers (e.g., ascorbic acid, hindered phenols, phenidone, etc.), surfactants, antistatic agents, waxes, ultraviolet radiation absorbers, mild oxidizing agents, and brighteners may be used without adversely affecting the practice of the invention.

Where the term group is used in describing substituents, substitution is anticipated on the substituent for example, alkyl group includes ether groups (e.g., $CH_3$—$CH_2$—$CH_2$—O—$CH_2$—), haloalkyls, nitroalkyls, carboxyalkyls, hydroxyalkyls, sulfoalkyls, etc. while the term alkyl or alkyl moiety includes only hydrocarbons. Substituents which react with active ingredients, such as very strong reducing or oxidizing substituents, would of course be excluded as not being sensitometrically inert or harmless.

EXAMPLES

In the examples below, the following abbreviations are used: VDM refers to vinyldimethylazlactone; HEMA refers to 2-hydroxymethyl methacrylate; ASATBA refers to mono-tetrabutylammonium aspartate; DMAEMA-$C_{16}$ refers to 2-dimethylaminoethyl methacrylate quaternized with 1-bromohexadecane as described in copending case U.S. Ser. No. 07/658,983.

All chemicals used below were obtained from Aldrich Chemical Co., Milwaukee, Wis.) unless otherwise specified. Products were characterized by one or more of the following techniques: $^1$H nuclear magnetic resonance, ultraviolet-visible, and infrared spectroscopies; melting point.

Example 1

1-Methyl-4-methylaminopiperidine (51.2 g), 66 ml dimethyl sulfoxide, 33.0 g 4-fluorobenzaldehyde, and 53.3 g potassium carbonate were combined in a 500 ml three-necked flask fitted with a mechanical stirrer and a condenser. The stirred solution was heated to 90° C. for 72 hr. After cooling to room temperature the mixture was poured into 1 liter of water with stirring. The mixture was extracted with 300 ml ethyl acetate. The organic layer was washed with 100 ml water, then dried over anhydrous magnesium sulfate. Upon filtration and evaporation of the ethyl acetate under reduced pressure 35.0 g of N-methyl-N-(N-methylpiperidin-4-yl)-4-aminobenzaldehyde was obtained as a liquid.

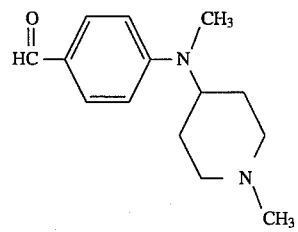

Example 2

Coumarin 334 (Eastman Kodak, Rochester, N.Y.) 0.28 g, 0.24 g N-methyl-N-(N-methylpiperidin-4-yl)-4-aminobenzaldehyde (prepared above), 0.10 g piperidinium acetate, and 40 ml toluene were combined in a 100 ml round-bottomed flask equipped with a Dean-Stark trap and condenser. The solution was refluxed for 21 hr with removal of water collected in the Dean-Stark trap. The solvent was then removed under reduced pressure and 50 ml water was added. The precipitated solid was filtered, washed with cold ethanol, and dried to give 1 as a red dye; $\lambda_{max}$ (ethanol)=495 nm.

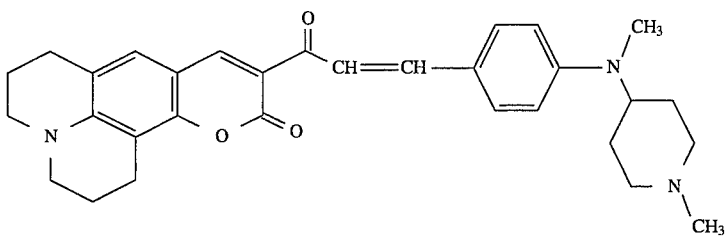

Example 3

7-Diethylamino-3-acetylcoumarin (1.04 g, prepared according to the procedure described in U.S. Pat. No. 4,147,552), 1.20 g N-(2-N-piperidinylethyl)-N-ethyl-4-aminobenzaldehyde, 0.10 g piperidinium acetate, and 40 ml toluene were placed in a 100 ml round-bottomed flask fitted with a Dean-Stark trap and condenser. The solution was refluxed for 16 hr with removal of collected water. The toluene was evaporated under reduced pressure and a mixture of 20 ml water and 5 ml ethanol was added to the resultant viscous material. Upon stirring a solid precipitated which was isolated by filtration and drying to give 1.5 g of 2 as a red solid; $\lambda_{max}$ (ethanol)=475 nm.

Example 6

Dye 5 was prepared according to the procedure of Example 2 using N-(2-hydroxyethyl)-N'-piperazinylbenzaldehyde (prepared from N-(2-hydroxyethyl)piperazine according to Example 1) in place of N-methyl-N-(N-methylpiperidin-4-yl)-4-aminobenzaldehyde. Compound 5 had $\lambda_{max}$ (ethanol)=485 nm.

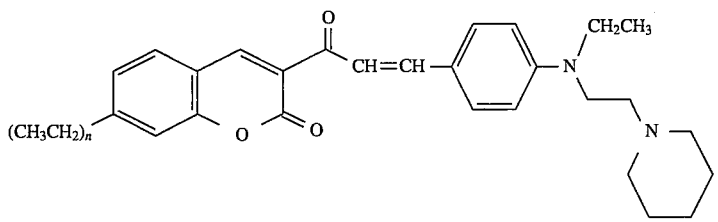

Comparative Example 4

Dye 3 was prepared according to the procedure of Example 3 using 4-(N,N-diethylamino)benzaldehyde in place of the N-(2-N-piperidinylethyl)-N-ethyl-4-aminobenzaldehyde used in Example 3. Compound 3 had $\lambda_{max}$ (ethanol)=475 nm.

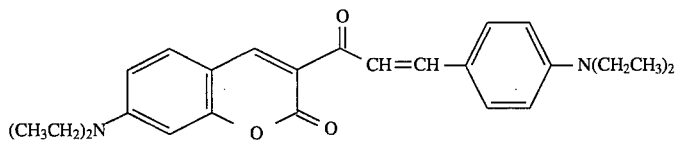

Example 5

Dye 4 was prepared according to the procedure of Example 3 using N-methyl-N-(N-methylpiperidin-4-yl)-4-aminobenzaldehyde in place of the N-(2-N-piperidinylethyl)-N-ethyl-4-aminobenzaldehyde used in Example 3. Compound 4 had $\lambda_{max}$ (ethanol)=475 nm.

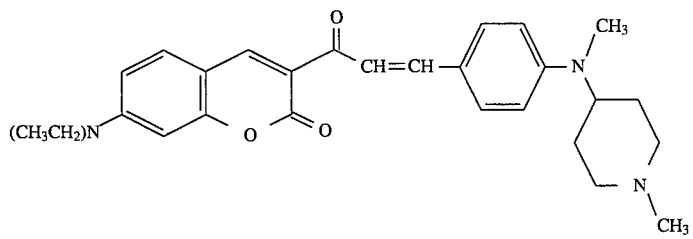

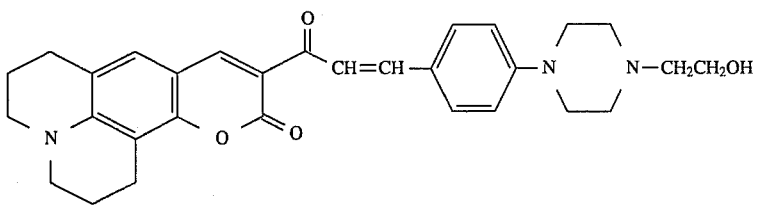

5

Comparative Example 7

10-[3-[4-(diethylamino)phenyl]-1-oxo-2-propenyl]-2,3,6,7-tetrahydro-1H, 5H, 11H-[1]benzopyrano[6,7,8-ij]quinolizin-11-one was prepared according to the procedure of Example 2 using N,N-diethylaminobenzaldehyde in place of N-methyl-N-(N-methylpiperidin-4-yl)-4-aminobenzaldehyde. Compound 6 had $\lambda_{max}$ (ethanol)=500 nm.

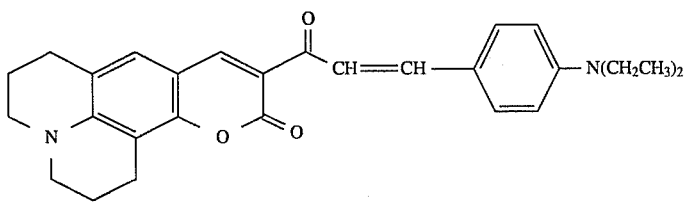

6

Example 8

10-(3-(N-ethyl-N-(2-piperidinoethyl)-4-aminophenyl-)propenoyl)-1H,2H,3H,5H,6H,7H,11H-[1]benzopyrano[6,7,8-ij]quinolizin-11-one (7) was prepared according to the procedure of Example 3 wherein 3-acetyl-7-diethylaminocoumarin was replaced by Coumarin 334; (Eastman Kodak, Rochester, N.Y.) $\lambda_{max}$ (ethanol)=503 nm

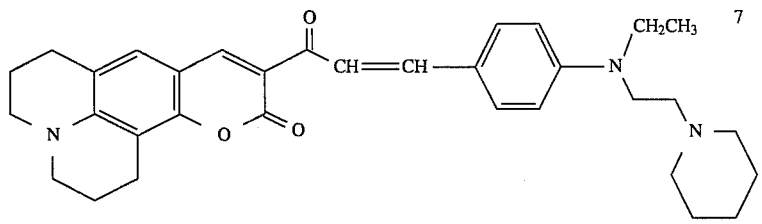

7

These examples demonstrate the use of the sensitizers of the present invention to cure polymerizable monomers.

Examples 9–14

A solution was prepared from (in parts by weight) 1.8 parts pentaerythritol tetraacrylate (SR-295, Sartomer Co., West Chester, Pa.), 3.10 parts carboxyl substituted urethane oligomer P-11 (61% in methyl ethyl ketone, described in U.S. Pat. No. 4,228,232), 6.0 parts of a 10% Formvar™ 12/85 (Monsanto Chemical Co., St. Louis, Mo.) solution in n-propanol/water (72/28), 60.0 parts n-propanol/water (72/28), 0.07 parts triethylamine (sufficient to solubilize the P-11 in n-propanol/water (72/28)). To 5.0 part aliquots of this solution were added 0.02 parts diphenyliodonium hexafluorophosphate (described in U.S. Pat. No. 3,729,313 (Smith), Apr. 24, 1973) and 0.006 parts of the sensitizers shown in Table 1. Electrochemically grained, anodized aluminum sheets were coated with the resultant solutions using a #12 wire wound rod (R&D Specialties, Webster, N.Y.) and dried at 70° C. for 1 minute. The coating weights of the dried plates were approximately 1.61 g/m². The coatings were then overcoated with a 5% by weight solution of poly(vinyl alcohol) (Gelvatol™ 20/30, Monsanto Chemical Co., St. Louis, Mo.) in water having 0.03% by weight Triton™ X-100 (Rohm and Haas, Philadelphia, Pa.) as surfactant using a #15 wire wound rod. The overcoated plates were then dried at 70° C. for 1 minute, placed in a Berkey Ascor model 1415-42 exposure unit with a 5 Kw metal-halide light source, then exposed for 2 seconds at the low intensity setting through a √2 21-step sensitivity guide (Stauffer Graphic Arts Co., South Bend, Ind.). The exposed plates were then developed by wiping with an aqueous developer solution consisting of 3% sodium metasilicate and 4% n-propanol. The number of steps (polymer image) remaining after exposure and development are shown in Table 1. The "ghost" values indicate the lowest exposure from which observable photopolymer was retained on the plate. The "solid" values indicate the exposure level at which the photopolymer appeared to completely cover the exposed step.

TABLE 1

| Example | Sensitizer | $\lambda_{max}$ (ethanol) | Steps Solid/Ghost |
|---|---|---|---|
| 9 | 1 | 495 | 16/18 |
| 10 | 5 | 485 | 15/17 |
| 11 | 6 | 500 | 14/16 |
| 12 | 2 | 475 | 15/16 |
| 13 | 4 | 475 | 14/15 |
| 14 | 3 | 475 | 11/13 |

Example 19–21

A solution of 0.3 g pentaerythritol tetraacrylate (SR-295, Sartomer Co., 50% in isopropanol/water azeotrope), 1.0 g of a copolymer of VDM (95%) and DMAEMA-$C_{16}$ (5%)

wherein the VDM groups were modified by reaction with HEMA (70%)/ASATBA (10%)/water (20%) (i.e., polymer having pendant ethylenic, carboxy, and quaternary ammonium groups) as a 33% solution in methyl ethyl ketone, (described in copending U.S. Ser. No. 07/658,983), and 6.0 g isopropanol water azeotrope. Two 6.0 g aliquots of this solution were each combined with the amount of sensitizer indicated in Table 2 and 40 mg diphenyliodonium hexafluorophosphate. These solutions were coated using a #22 wire wound rod (1.98 mil wet thickness) onto a mechanically grained silicated aluminum sheet (substrate A) and an ammonium bifluoride etched and silicated aluminum sheet (substrate B). Each plate was exposed through a √2 21-step sensitivity guide for two seconds in a 3M Model 70 exposure unit (tungsten iodide lamp, 3M Company, St. Paul, Minn.), then developed by mild rubbing with a cotton pad while submerged in a 0.1N sodium bicarbonate solution. The results are given in Table 2.

TABLE 2

| Example | Sensitizer | Substrate | Steps Solid | Steps Ghost |
|---|---|---|---|---|
| 15 | 7 | B | 15 | 16 |
| 16 | 7 | A | 13 | 16 |
| 17 (Control) | 6 | B | 10 | 11 |

Example 18–20

A solution of 2.0 g pentaerythritol tetraacrylate (SR-295, Sartomer Co., 50% in isopropanol/water azeotrope), 1.4 g carboxyl substituted urethane oligomer P-11 (61% in methyl ethyl ketone, described in U.S. Pat. No. 4,228,232), and 26.6 g isopropanol water azeotrope, 12.3 g Klucell™ M (a hydroxypropyl cellulose; Hercules Corp., Wilmington, Del.; 1.5% in isopropanol/water azeotrope), 0.07 g triethylamine, and 2.0 g millbase (Sunfast Blue pigment (Sun Chemical, Fort Lee, N.J.)/Formvar™ 12/85 (Monsanto Chemical Co., St. Louis, Mo.) 2 to 1 ratio as a 15% solids solution in isopropanol/water azeotrope). Aliquots (5.0 g) of this solution were combined with 6 mg of the sensitizer indicated in Table 3 and either 40 mg diphenyliodonium hexafluorophosphate or 20 mg tris(trichloromethyl)-s-triazine (TTT). These solutions were coated using a #22 wire wound rod (1.98 rail wet thickness) onto a mechanically grained silicated aluminum sheet. The plates were then dried by blowing hot air, then the coated plates were overcoated with a 5% by weight solution of poly(vinyl alcohol) (Gelvatol™ 20/30, Monsanto Chemical Co., St. Louis, Mo.) in water having 0.03% Triton™ X-100 (Rohm and Haas, Philadelphia, Pa.) as surfactant using a #16 wire wound rod. Each plate was exposed for 11 seconds using a 1 kW high pressure mercury-xenon light source directed through a monochromator with a 20 nm band pass filter centered at 488 nm through a √2 21-step sensitivity guide, then developed by mild rubbing with a cotton pad while submersed in an aqueous developer solution consisting of 2% sodium metasilicate and 4% benzyl alcohol. Speeds were determined by measuring the lamp output with a radiometer. The results are given in Table 3.

TABLE 3

| Example | Sensitizer | Initiator | Speed ergs/cm² | Steps Solid | Steps Ghost |
|---|---|---|---|---|---|
| 18 (Control) | 6 | Ph₂I⁺ PF₆ | 660 | 13 | 16 |
| 19 | 7 | Ph₂I⁺ PF₆ | 230 | 16 | 18 |
| 20 | 7 | TTT | 330 | 15 | 17 |

What is claimed is:

1. An aminoketone-substituted coumarin sensitizer having the formula:

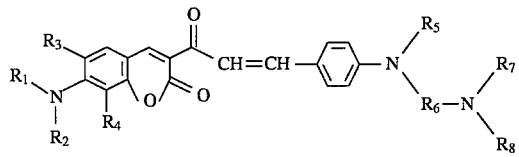

wherein

R₁ and R₂ each represent an alkyl group having 1 to 6 carbon atoms, and R₃ and R₄ each represent hydrogen, or at least one of R₁ and R₃ or R₂ and R₄ together represent an alkylene group having 2 to 4 carbon atoms;

R₅ represents an alkyl group having 1 to 6 carbons or H,

R₆ represents an alkylene group having 1 to 6 carbon atoms, and

R₇ and R₈ each independently represent an alkyl group having 1 to 6 carbon atoms, both R₇ and R₈ taken together represent an alkylene group having 4 to 6 carbon atoms, or R₅ or R₆ may be taken with R₇ or R₈ to represent a five, six, or seven membered heterocyclic ring group.

2. The sensitizer of claim 1 wherein R₁ and R₂ independently represent an alkyl group having 1 to 6 carbon atoms.

3. The sensitizer of claim 1 wherein R₇ and R₈ independently represent an alkyl group having 1 to 6 carbon atoms.

4. The sensitizer of claim 2 wherein R₇ and R₈ independently represent an alkyl group having 1 to 6 carbon atoms.

5. The sensitizer of claim 1 wherein R₇ and R₈ together represent an alkylene group of 4 to 6 carbon atoms forming a cyclic group with the N atom to which they are attached.

6. The sensitizer of claim 2 wherein R₇ and R₈ together represent an alkylene group of 4 to 6 carbon atoms forming a cyclic group with the N atom to which they are attached.

7. The sensitizer of claim 1 wherein R₅ or R₆ may be taken with R₇ or R₈ to represent the necessary atoms to form a five, six, or seven membered heterocyclic ring group.

8. The sensitizer of claim 2 wherein R₅ or R₆ may be taken with R₇ or R₈ to represent the necessary atoms to form a five, six, or seven membered heterocyclic ring group.

9. The sensitizer of claim 5 wherein R₅ comprises an alkyl group of 1 to 6 carbon atoms.

10. The sensitizer of claim 1 wherein R₅ or R₆ may be taken with R₇ or R₈ to represent the necessary atoms to form a five, six, or seven membered heterocyclic ring group.

11. The amino-ketone substituted coumarin sensitizer of claim 1 wherein the sensitizer is 7-(diethylamino)-3-[3-[4-(N-ethyl-N-2-piperidinoethylamino)phenyl]-1-oxo-propenyl]-2H-1-benzopyran-2-one.

* * * * *

UNITED STATES PATENT AND TRADEMARK OFFICE
CERTIFICATE OF CORRECTION

PATENT NO.: 5,534,633                            Page 1 of 2
DATED:       July 9, 1996
INVENTOR(S): Ali It is certified that error appears in the above-identified patent and that said Letters Patent is hereby corrected as shown below:

Col. 7, lines 25-34, formula should be:

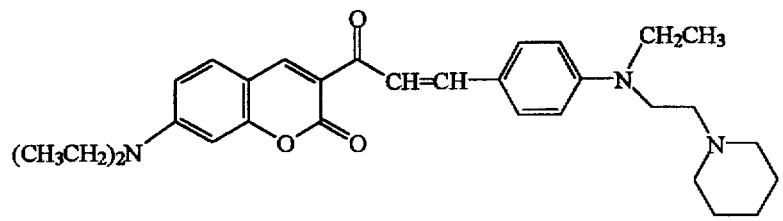

Col. 7, lines 58-67, formula should be:

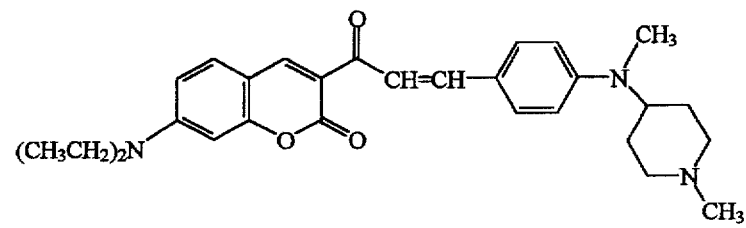

UNITED STATES PATENT AND TRADEMARK OFFICE
CERTIFICATE OF CORRECTION

PATENT NO. : 5,534,633
DATED : July 9, 1996
INVENTOR(S) : Ali

It is certified that error appears in the above-indentified patent and that said Letters Patent is hereby corrected as shown below:

Col. 10, line 63, "Example 19-21" should be Examples --15-17--.

Signed and Sealed this

Twenty-ninth Day of April, 1997

*Attest:*

BRUCE LEHMAN

*Attesting Officer*     *Commissioner of Patents and Trademarks*